United States Patent [19]

Bajpai et al.

[11] Patent Number: 4,753,382
[45] Date of Patent: Jun. 28, 1988

[54] COMPONENT INSERTION APPARATUS

[75] Inventors: Arun K. Bajpai, Aloha; Carl G. Brown, Portland, both of Oreg.

[73] Assignee: Nova Automatic Systems, Inc., Portland, Oreg.

[21] Appl. No.: 609,571

[22] Filed: May 10, 1984

[51] Int. Cl.⁴ .............................................. H05K 3/30
[52] U.S. Cl. ..................................... 227/99; 227/109; 227/149; 29/741; 29/837
[58] Field of Search ................. 227/99, 103, 109, 135, 227/149, 155, 107; 29/741, 837, 54, 564.1, 566, 809

[56] References Cited

U.S. PATENT DOCUMENTS

| | | | |
|---|---|---|---|
| 2,850,737 | 9/1958 | Walsh | 29/741 X |
| 2,893,008 | 7/1959 | Gagnon | 227/103 |
| 2,901,127 | 8/1959 | Hazel | 29/741 X |
| 3,591,911 | 7/1971 | Goldschmied | 29/564.1 X |
| 3,780,415 | 12/1973 | Ragaro | 29/741 X |
| 4,031,180 | 6/1977 | Pierson | 29/741 |
| 4,063,347 | 12/1977 | Woodman, Jr. | 29/741 X |
| 4,293,998 | 10/1981 | Kawa et al. | 29/564.1 |
| 4,329,776 | 5/1982 | Mori et al. | 29/741 |
| 4,455,735 | 6/1984 | Scrantom | 29/564.1 |
| 4,539,740 | 9/1985 | Scrantom et al. | 29/741 X |

FOREIGN PATENT DOCUMENTS 0585632 12/1977 U.S.S.R. ............................... 29/741

Primary Examiner—Howard N. Goldberg
Assistant Examiner—Taylor J. Ross
Attorney, Agent, or Firm—Jack E. Day

[57] ABSTRACT

This invention relates to an apparatus for inserting components into workpieces, particularly for insertion of electrical components into printed circuit boards. Multiple component magazines are provided on a shuttle which places the desired component beneath an inserter. The inserter moves through a limited reciprocation to pick up a component from the shuttle, and the shuttle is withdrawn from the path of the inserter. The inserter then moves downward to insert the component. The inserter includes an ejector which maintains contact with the inserted component during withdrawal of the inserter. The ejector includes a shock absorber which gives way if unusual resistance is met during insertion. The shock absorber is spring-biased, and the degree of stiffness of the spring is adjustable.

4 Claims, 1 Drawing Sheet

COMPONENT INSERTION APPARATUS

FIELD OF THE INVENTION

This invention relates generally to apparatus for inserting components into prepared workpieces incorporating many such components, and more particularly, it relates to an improved apparatus for inserting electronic components into printed circuit boards.

BACKGROUND OF THE INVENTION

The introduction of printed circuit boards, known as PCBs, in the electronics industry created the need for accurate placement of components and rapid insertion thereof on the boards. Many machines have been developed to provide more efficient solutions to these problems.

Although many efforts have been made to develop component insertion machines, most of them are not pertinent to the present invention. Some of them are for inserting a single type of component, such as that disclosed in Walsh U.S. Pat. No. 2,850,737, which is designed to insert radial-lead disc-type capacitors into printed circuit board. The insertion mechanism picks up the component on the retraction stroke of the insertion cycle and inserts it on the next down stroke.

Gagnon U.S. Pat. No. 2,893,008 discloses a component inserter which has multiple inserters spaced at intervals along a production line, each of which handles a different type of component.

Hazel U.S. Pat. No. 2,901,127 discloses an insertion device which picks up a component and forms the leads into a desired configuration before inserting it into holes in a printed circuit board.

Pierson U.S. Pat. No. 4,030,180 discloses an insertion machine which twists from its normal insertion attitude to pick up a component, then twists back to the original attitude for inserting it into the workpiece. The insertion head is consequently complex.

Mori et al U.S. Pat. No. 4,329,776 discloses an insertion machine which carries a multiplicity of parts on a conveyor belt of some kind, i.e., a tape to which the parts adhere, and performs various forming, trimming, and other operations prior to inserting the parts into a workpiece.

Although the aim of the above existing devices is more-or-less the same as that of the present invention, the structures and processes are substantially different.

SUMMARY OF THE INVENTION

The present invention provides an improved component insertion apparatus that is substantially less complex than previous insertion devices, and permits an improved insertion rate substantially greater than has been feasible with earlier machines.

There are several novel aspects of the present invention when compared with earlier insertion apparatus. The inserter means of the present invention picks up the component to be inserted and inserts it into the desired position in the workpiece, rather than driving it into the workpiece directly from a component storage fixture, as do many earlier devices. Further, the present invention provides a shuttle means containing at least one component storage means, the shuttle means moving the component into position so that the inserter means, as heretofore described, can pick up the component for insertion into the workpiece, rather than moving the inserter head from the component position to the required workpiece position. Again, the inserter means of the present invention incorporates an ejector means which presses against the component after the inserter means has inserted it into the workpiece, and hold the component in place while the inserter means is withdrawn from the inserted component. Still further, the shuttle of the present invention contains several component storage means which permits several components to be inserted in the same production cycle, further permitting those components which are used several times in a given PCB to be placed closer to the inserter means, than those components which are used only once, thus reducing the average production time for a given design of PCB. Finally, the present invention provides a novel shock-absorber that prevent components or the surface of PCBs from being damaged in case of an abortive attempt to insert a component into an improper position or because of other errors in the inserton process.

Those skilled in the art will perceive that the above features can be combined in any of several ways to provide any of several novel combinations of features not heretofore available, while increasing the insertion rate and decreasing the complexity of apparatus used for component insertion of PCBs. It will also be perceived that the present invention lends itself to being automated and to being controlled by microprocessor so that many differently arranged PCBs can be accommodated merely by changing programs and component storage means.

DETAILED DESCRIPTION OF THE PRESENT INVENTION

Figure 1:
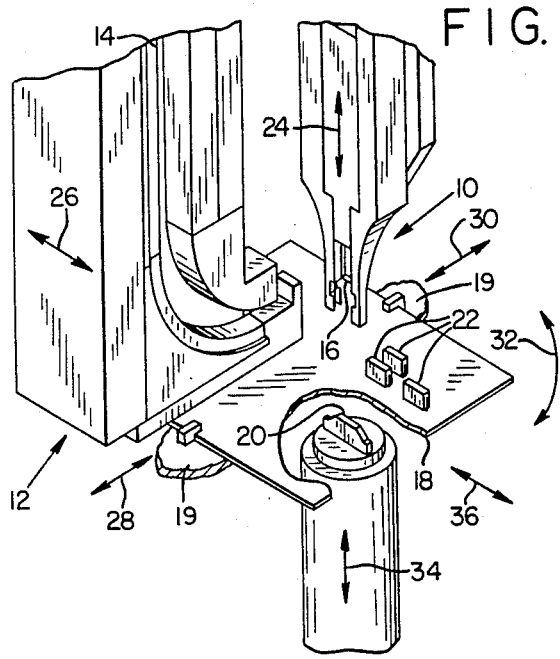
FIG. 1 is an oblique perspective view of the elements of the present invention disclosing the physical relationship of the various elements.

FIG. 1 discloses the operative elements of the present invention in their relationship at rest, immediately prior to commencing the component insertion cycle. Only those parts are shown which are necessary to an understanding of the novel aspects of the invention, as component insertion devices are well-known in the art.

Generally, the present invention includes inserter means 10, shuttle means 12, component storage means 14, component ejector means 16, workpiece 18, and anvil 20. The workpiece 18 is shown with three components 22 mounted on it.

More specifically, inserter means 10 has an up-and-down motion, as disclosed by the arrow 24 in FIG. 1. Shuttle means 12 can move either direction to the side, as disclosed by arrow 26, and forward and backward, as disclosed by arrow 28 in FIG. 1. Component ejector means 16 moves up-and-down, similarly to inserter means 10, but separately. Workpiece 18 is mounted on an X-Y table 19 (not shown, except for representative poritons thereof) and thus can move sideways, as disclosed by arrow 36, and forward and backward, as disclosed by arrow 30. If a rotating table is mounted on the X-Y table, as would be desirable in some embodiments, workpiece 18 could also rotate, as disclosed by arrow 32. Anvil 20 has an up-and-down motion, as disclosed by arrow 34 and, if desired, could also rotate (arrow not shown). Each of these motions will be discussed in greater detail hereinafter, as the operation and interrelationship of the separate parts is discussed.

Figures 2, 3, 4:
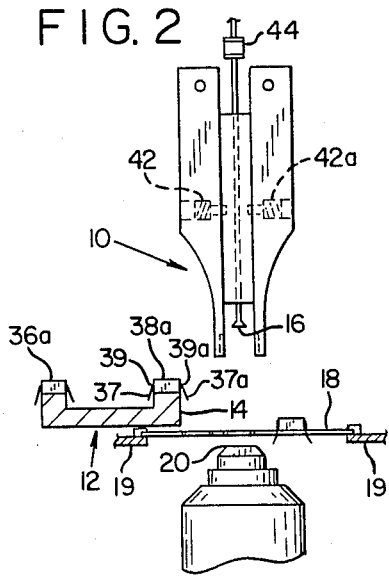
FIG. 2 is a profile view, from the front, of the elements of the present invention, showing them in rest position immediately prior to commencement of the insertion cycle.
FIG. 3 is a profile view, from the front, disclosing the relationship of the elements as the shuttle means moves the component storage means into pickup position.
FIG. 4 is a profile view, from the front, disclosing the relationship of the elements as the inserter means descends to pick up the component next to be inserted.

Turning now to FIG. 2, we see a view of the parts of the invention at rest, immediately prior to commencing the component insertion cycle. Inserter means 10 is at rest position, with ejector means 16 retracted to the top of its range of travel with respect to inserter means 10. Shuttle means 12 is shown drawn to one side of the inserter means, although as disclosed in FIG. 1 it would normally travel perpendicularly to the plane of the paper to move the components 36a–36n and 38a–38n to intersect with the movement of inserter means 10. Workpiece 18, normally a printed circuit board (PCB), is positioned with respect to inserter 10 so that when inserter means 10 descends with a component gripped therein, the leads of the component will pass through holes drilled in PCB 18. Anvil 20 is retracted at the bottom of its normal range of travel so that it will not interfere with the insertion of components through the holes in PCB 18.

Figure 8:
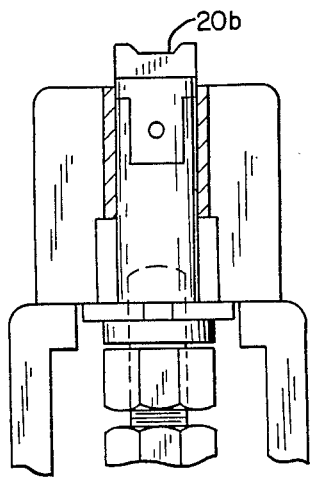
FIG. 8 is a cross-sectional view of the anvil holder with an anvil mounted thereon.
Figure 5:
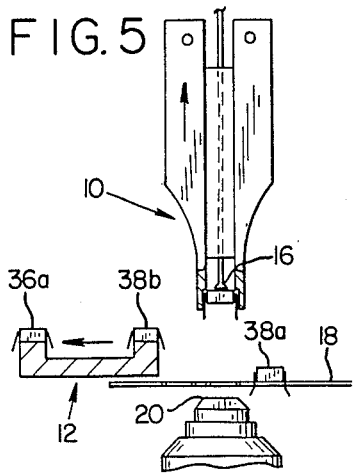
FIG. 5 is a profile view, from the front, disclosing the retraction of the inserter means with the component contained therein, and the retraction of the shuttle means from the line of action of the inserter means.
Figure 6:
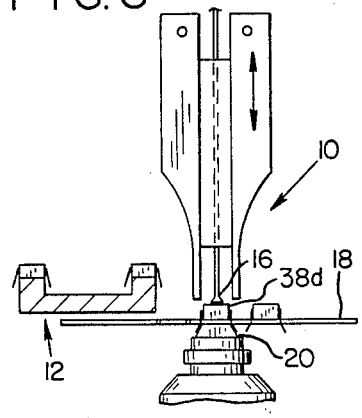
FIG. 6 is a profile view, from the front, disclosing the inserter means starting to retract while the ejector means maintains the component in position on the workpiece, and the movement of the anvil means into crimp position while ejector means is pressing against the component.
Figure 7:
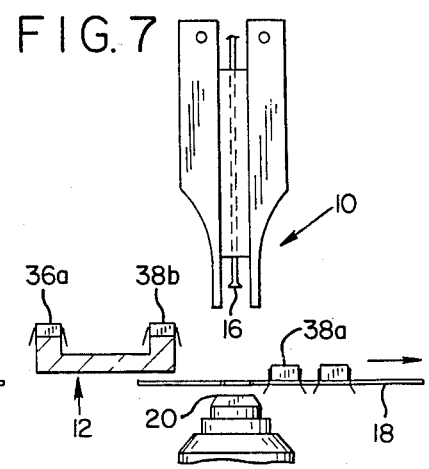
FIG. 7 is a profile view, from the front, disclosing the retraction of the anvil means and the movement of the workpiece to bring it into position for the next component to be inserted.

FIG. 3 discloses the commencement of the component insertion cycle. Shuttle 12, with its attendant component storage means (not shown) moves so that a desired component, in this case, component 38a, is directly beneath inserter means 10 and in its line of travel. Inserter means 10 include jaws 40 and 40a, which can be passive and spring-loaded, as shown (springs 42 and 42a in FIG. 2), active and powered (not shown), or a combination of both. Two or more jaws can be used. Preferred embodiments include a two-jaw passive inserter for picking up two lead (or point) components or a four-jaw active inserter for picking up multi-lead (or point) components. It will be seen, in FIGS. 1-4 that jaws 40 and 40a have formed on their inner faces narrow grooves or channels 41 and 41a, respectively, extending upwardly from the tips of the jaws. These grooves have formed at their upper ends shoulders 43 and 43a, respectively, and are sized to admit the leads 37 and 37a, also respectively, of components 36a–n, 38a–n, etc., as inserter means 10 comes down over said components in the pickup operation described hereinafter. The bends 39 and 39a of the leads 37 and 37a, respectively, abut against shoulders 43 and 43a, also respectively when inserter means 10 is fully extended in the component pickup portion of the insertion cycle, as hereinafter described. The abutting of bends 39 and 39a against shoulders 43 and 43a, respectively, permits the crimping operation to be performed described hereinafter in greater detail. The jaws of inserter means 10 in the disclosed embodiment are spaced apart a small amount greater than the width of component 38a at the bends 39 and 39a, respectively, of the leads, but less than the distance separating the tips of the leads so that, as the inserter descends, as disclosed in FIG. 4, the jaws frictionally and slidably engage the leads of component 38a with sufficient force that it will be held in place by the jaws 40 and 40a of inserter means 10 until it is positively ejected at the appropriate time in the insertion cycle by ejector 16. As further disclosed in FIG. 4, inserter means 10 desoends until the upper surface of component 38a comes in contact with ejector means 16 and bends 39 and 39a of leads 37 and 37a matingly come into contact with shoulders 43 and 43a in jaws 40 and 40a, all respectively, as described hereinbefore, whereupon inserter means 10 reverses its direction of travel as disclosed in FIG. 5, withdrawing component 38a from component storage means 14 (not shown) until shuttle means 12 can retract to its rest position out of the line of travel of inserter means 10. As stated before, the preferred embodiment retracts shuttle means 12 into the plane of the drawing, rather than sideways as shown for simplicity in FIGS. 3-5. After shuttle means 12 retracts, inserter means 10 descends, as disclosed in FIG. 6, and inserts component 38a into the holes at the appropriate position on PCB 18. When inserter means 10 approaches to within a desired distance (0.015" in the preferred embodiment), it stops, and anvil 20 moves upward, as disclosed in FIG. 6, performing a crimping action on the leads of component 38a. The position to which anvil 20 can be moved upward is adjustable, so that the degree of crimping is also adjustable. In the preferred embodiment, the leads are bent to an angle of 27½ degrees, which could be greater or less, depending upon the requirements of particular components. The shape of anvil 20 can also be such as to crimp the leads inwardly, as disclosed at 20b in FIG. 8. The supporting structure 42 of anvil 20 could be rotatable, holding a plurality of anvils which could be selected accordingly to the requirements of the components and workpiece. Such rotatability and selection are by means well-known in the art. After the crimping operation, inserter means 10 reverses direction, to retract to its uppermost rest position until the next portion of the insertion cycle. However, while inserter means 10 is retracting, ejector means 16 maintains its position relative to the component 38a and the surface of PCB 18, thus ejecting component 38a from inserter means 10, as disclosed in FIG. 6.

Shuttle means 12 can carry one or more of components storage means 14 of a kind well-known in the art, each capable of carrying many components 38a–n, as required by a particular production operation. As stated hereinbefore, shuttle means 12 has two motions, forward and backward with respect to the front of the apparatus (or out of and into the plane of the drawing, respectively), and in a sidewise manner. The forward and backward movement is to move the component storage means 14 into and out of, respectively, the line of action of inserter means 10, so that the selected component can be picked up for insertion. The sidewise movement of shuttle means 10 is to select, from among a multiplicity of storage means 14, the storage means containing the component next programmed to be inserted into PCB 18. Those component storage units containing components used in the greatest quantities in a given production operation will be located in the center, or closest to the center of travel, of shuttle means 12. Those components used in lesser quantities would be located more distant from the center of travel of the shuttle. It will be perceived by those skilled in the art that this arrangement results in the lowest average insertion time per cycle of any arrangement of component storage means on the shuttle means. It will also be seen by those skilled in the art that the selection of the component storage means to next be presented to the inserter means for pickup and insertion can be performed during the time that the apparatus of the present invention is performing other functions, thus reducing cycle time. That is, while inserter means 20 is descending to insert component 38a into PCB 18, or while PCB 18 is being moved to the next programmed location as hereinafter more completely described), shuttle means 12 is moving so that when inserter means 10 is ready to pick up a new component, the proper component storage means will be in place to be moved into the line of action of inserter means 10, by the forward movement of shuttle means 12, as heretofore described.

As inserter means 10 is retracted to its uppermost position, PCB 18 is moved to its next location for insertion of the next component 38b or 36a. In the meantime, shuttle means 12 will have moved into the line of travel of inserter means 10 so that when PCB 18 is in location, component 38b or 36a, having been picked up by inserter means 10, can be inserted into therein.

It will be seen by those skilled in the art that any of several sequences of the various movements hereinbefore described can be used as a program without departing from the spirit or intent of the invention. However, the most efficient sequence for most operations is probably the sequence where shuttle means 12 retracts from pickup position as inserter means 10 retracts from component pickup; thereupon shuttle means 12 moves the next needed component storage means 14 into position while inserter means 10 inserts, ejects and retracts, shuttle means 12 thereafter moving selected component storage means 14 into position in the line of action of inserter means 10 for the next component pickup; meanwhile, workpiece or PCB 18 moves into position for the next insertion while inserter means 10 is retracting from insertion and is picking up the next component; anvil 20 moves up and crimps the leads (after inserter 10 has inserted the component), holds in place while inserter means 10 retracts and ejector means 12 holds the component in position, and then retracts while ejector means 12 retracts into rest position; whereupon the cycle starts over again. If workpiece or PCB 18 is held on a rotary table as well as an X-Y table, the rotation thereof to the next appropriate attitude would take place while the X-Y table was moving to the next required position. If a plurality of anvils was mounted on a rotatable anvil support, rotation of the next anvil needed would take place immediately following retraction of the anvil support from its crimping position.

Figure 9:
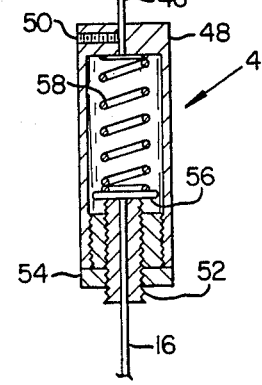
FIG. 9 is a cross-sectional view of the shock-absorber on the ejector stem which provides an extremely low-force slippage mechanism to reject deformed or broken components.

FIG. 9 discloses the structure of the novel "ZERO-FORCE" shock-absorber means 44 of the present invention, which prevents damage or ineffective insertion of components. Upper rod 46 is removably fixedly secured to the case 48 by set screw 50 or the like fastener. The lower rod 16 (which is the upper portion of ejector means 16) slidably passes through threaded bushing 52 which, in turn, is threaded into the lower portion of case 48 and is securely fastened in place by lock nut 54. The top end of ejector means 16 has formed thereon flattened portion 56, which compresses spring 58 against the upper end of the cavity within case 48. The degree of stiffness of spring 58 is set by the adjustment of threaded bushing 52, and is so adjusted that if component 38a in inserter means 10 meets any unusual resistance during insertion (such as would be caused by lack of mounting holes, mislocation of the component, foreign objects obstructing the insertion location, or the like), the novel shock-absorber 44 gives way for the remaining distance of travel of inserter means 10. When inserter means 10 retracts, and component 38a is ejected by ejector means 16, it can be removed by compressed air or any other appropriate means, while the apparatus moves on to the next insertion cycle.

The degree of adjustment of response of the novel shock-absorber 44 is sufficiently sensitive that the delicate leads of the smallest components are not bent if the component encounters a position where no mounting holes have been provided. The degree of compression is adjustable from a few grams of pressure to the full force exerted by the ejector solenoid, which is obtained by adjusting threaded bushing 52 so that spring 58 is fully compressed and, for all practical purposes, the flattened end 56 of ejector means 16 is pressing directly against the upper rod 46.

As an example of the performance of the present invention, insertion and crimping of a single type of component has been accomplished at a rate of 6,000 components per hour, or nearly twice as great as with existing machines. These insertions have been performed at an accuracy of plus or minus 0.001" in positioning, and accuracies of plus or minus 0.0005" in positioning have been consistently obtained at a somewhat lesser rate. Obviously, insertion rates will be somewhat less as the number of types of components used is increased.

It will be realized by those skilled in the art that the disclosed embodiment of present invention contemplates the insertion of components which are alike, or which have more-or-less similar dimensions. Many different types of components are packaged in identical packages and these could be inserted by the apparatus of the present invention if the different components were to be dispersed into separate component storage means mounted appropriately as described hereinbefore on the shuttle means. Where components of different physical structures were involved, they could be grouped by structure type and inserted by an insertion means of a different physical configuration in another machine, with the transfer of workpieces between machines being done manually or automatically.

Those skilled in the art will recognize that it would be possible to provide component inserter means of several different designs and sizes mounted on a rotatable shaft, so that inserter means of appropriate designs and/or sizes could be rotated into position to pick up components of different physical configurations as needed to complete the production of a given workpiece or PCB 18, without departing from the spirit or intent of the present invention.

It will also be recognized by those skilled in the art that the present invention lends itself to being controlled by numerically-controlled microprocessor equipment and programming methods such as are well-known in the art without departing from the spirit or intention of the invention.

Further, it will be recognized by those skilled in the art that any of several types of energy sources could be used to power the equipment herein without affecting the claims herein. Electrical, hydraulic, pneumatic or other types of controls, or any combination of them, could easily be used to perform the aforementioned operations.

The terms and expressions which have been employed in the foregoing specification is used therein as terms of description and not of limitation, and there is no intention, in the use of such terms and expressions, of excluding equivalents of the features shown and described or portions thereof, it being recognized that the scope of the invention is defined and limited only by the claims which follow.

What we claim as our invention is:

1. In a component insertion apparatus having workpiece holding means for holding a workpiece into which components are to be inserted, storage means for storing said components prior to insertion, inserter means for picking up one of said components from said storage means and inserting same into said workpiece, the improvement comprising:
   a. shuttle means holding more than one storage means, said shuttle means having:
      1. a sidewise movement for bringing a selected one of said storage means to a rest position;
      2. a forward movement transverse to said sidewise movement to bring said selected one of said storage means from said rest position to a pickup position directly beneath said inserter means, wherein said inserter means picks up said one of said components from said selected one of said storage means, and a backward movement whereby said shuttle means thereafter retracts said selected one of said storage means to said rest position; and
   3. said inserter means thereafter inserting said one of said components into said workpiece, following said return of said selected one of said storage means to said rest position.

2. The component insertion apparatus of claim 1, wherein said inserter means has therein adjustable shock absorber means, said shock absorber means giving way during insertion of said component if other than a preset resistance to said insertion is encountered during said insertion.

3. In a component insertion apparatus having workpiece holding means for holding a workpiece into which components are to be inserted, storage means for storing said components prior to insertion, inserter means for picking up one of said components from said storage means and inserting same into said workpiece, the improvement comprising:
   a. shuttle means holding more than one storage means, said shuttle means having:
      1. a sidewise movement for bringing a selected one of said storage means to a rest position;
      2. a forward movement transverse to said sidewise movement to bring said selected one of said storage means form said rest position to a pickup position directly beneath said inserter means, wherein said inserter means picks up one of said components form said selected one of said storage means, and a backward movement whereby said shuttle means thereafter retracts said selected one of said storage means to said rest position;
   b. said inserter means thereafter inserting said one of said components into said workpiece following said return of said selected one of said storage means to said rest position; and
   c. said inserter means containing therein ejector means for ejecting said component from said inserter means after said inserter means has inserted said component into said workpiece, said ejector means holding said component in said workpiece while said inserter means in retracting from said workpiece.

4. The component insertion apparatus of claim 3, wherein said inserter means has therein adjustable shock absorber means, said shock absorber means giving way during insertion of said component if other than a preset resistance to said insertion is encountered during said insertion.

* * * * *